United States Patent [19]
Purdy et al.

[11] Patent Number: 5,729,138
[45] Date of Patent: Mar. 17, 1998

[54] SLICE-BY-SLICE VARIATION OF PULSE SEQUENCE PARAMETERS IN MULTISLICE TWO-DIMENSIONAL IMAGE ACQUISITIONS

[75] Inventors: David E. Purdy, East Windsor; David M. Thomasson, Edison, both of N.J.

[73] Assignee: Siemens Medical Systems, Inc., Iselin, N.J.

[21] Appl. No.: 516,662

[22] Filed: Aug. 18, 1995

[51] Int. Cl.$^6$ .............................................. G01R 33/56
[52] U.S. Cl. ............................................................ 324/309
[58] Field of Search .................................. 324/300, 307, 324/309, 314, 318, 322; 128/653.2

[56] References Cited

U.S. PATENT DOCUMENTS

| | | | |
|---|---|---|---|
| 4,999,580 | 3/1991 | Meyer et al. | 324/309 |
| 5,105,152 | 4/1992 | Pauly | 324/309 |
| 5,189,371 | 2/1993 | Conolly et al. | 324/309 |
| 5,233,301 | 8/1993 | Meyer et al. | 324/309 |
| 5,235,278 | 8/1993 | McKinnon et al. | 324/309 |
| 5,270,652 | 12/1993 | Dixon et al. | 324/309 |
| 5,270,898 | 12/1993 | Hu et al. | 324/309 |
| 5,283,526 | 2/1994 | Spielman et al. | 324/309 |
| 5,311,132 | 5/1994 | Noll et al. | 324/309 |
| 5,422,572 | 6/1995 | Yao | 324/309 |
| 5,500,593 | 3/1996 | Loncar et al. | 324/309 |

*Primary Examiner*—Sandra L. O'Shea
*Assistant Examiner*—Roger Phillips
*Attorney, Agent, or Firm*—Mark H. Jay

[57] ABSTRACT

Techniques for conducting two-dimensional fat-saturated multislice MR studies are disclosed. The frequency of saturation pulses is varied on a slice-by-slice basis. In a second preferred embodiment, the phase, or the phase and frequency, of one or more elements of a spatially and spectrally selective MR pulse sequence are varied on a slice-by-slice basis. In a third preferred embodiment, the order in which MR image data is acquired from a plurality of slices is changed so as not to minimize the time between inadvertent saturation of the water signal in a particular slice and the acquisition of MR image data from that slice.

7 Claims, 10 Drawing Sheets

SLICE-BY-SLICE VARIATION OF PULSE SEQUENCE PARAMETERS IN MULTISLICE TWO-DIMENSIONAL IMAGE ACQUISITIONS

BACKGROUND OF THE INVENTION

The invention relates to magnetic resonance ("MR") imaging, and further relates to pulse sequences for use in MR imaging. In its most immediate sense, the invention relates to two-dimensional multislice MR studies in which the fat signal (or other undesired signal) is suppressed from the MR image or from which such signal does not contribute to the MR image.

Radiologists typically wish to view images of water-containing tissues without being distracted by the bright signal from fat. For this reason, suppression of the fat signal has long been considered important.

One category of known fat suppression techniques generally relies upon the use of so-called fat saturation pulses. A fat saturation pulse is a radiofrequency ("RF") pulse that has a frequency chosen to exactly correspond to the frequency of the fat resonance and that is followed by a dephasing magnetic field gradient. A fat saturation pulse nutates the net magnetizations of the fat molecule nuclei. In the equilibrium condition before nutation, these nuclei are aligned with the axis of the main magnetic field of the MR imager (the "z-axis"); when ideally nutated, these nuclei all lie in the x-y plane. After nutation, the dephasing magnetic field gradient dephases the coherent in-plane magnetization of the nutated fat molecule nuclei, so they cannot produce an MR signal. This inability to produce an MR signal remains until the nutated nuclei have relaxed to a state in which they once again are aligned with the z-axis. Once this has taken place, further RF pulses may give rise to coherent x-y plane magnetization and observable MR signal (the "fat signal"). In this way, the fat signal is "saturated" or effectively eliminated, while the net magnetization of the water molecules remains aligned with the z-axis, ready for nutation into the x-y plane and imaging using a conventional imaging MR pulse sequence. In fat-saturated two-dimensional MR studies, the fat saturation pulse and subsequent dephasing gradient are applied immediately before the excitation step of a slice, i.e. immediately before the desired resonance (usually, the water resonance) is excited by RF pulses. This minimizes the time available for the nutated fat molecule nuclei to realign with the z-axis of the imager and so give rise to an observable, and therefore undesirable, fat signal. Since conventional fat saturation RF pulses are unaccompanied by a magnetic field gradient, the fat nuclei in the entire sample region affected by the RF coil are, in the ideal case, saturated.

Another category of known fat suppression techniques generally relies upon the use of excitation pulses which nutate the net magnetization only of desired molecules e.g. water in a particular slice. This is discussed in Meyer et al., Magnetic Resonance in Medicine, Vol. 15, pp. 287-304 (1990). After such nutation, the remaining part of a conventional MR pulse sequence is used to read out lines of MR data from which an MR image may be reconstructed. In other words, if an excitation step of a conventional MR pulse sequence has only one spatially selective RF excitation pulse, this RF excitation pulse is replaced by another RF pulse that is not only spatially, but also spectrally, selective. Alternatively, if an excitation step of a conventional MR pulse sequence contains two or more RF pulses, one of the spatially selective RF pulses is replaced by another RF pulse that is not only spatially selective, but spectrally selective as well.

Both of these techniques have a common disadvantage when used in two-dimensional MR acquisitions of the multislice type. In a multislice acquisition, only a portion of the data required to reconstruct the image is acquired from one slice before exciting the desired resonance of the next slice and acquiring data from this next slice. To limit interactions between slices, it is common practice to avoid exciting the desired resonances from spatially adjacent slices in temporal order. Thus, in a conventional interleaved two-dimensional multislice acquisition having N slices ordered by position along a direction orthogonal to the slice plane, there is an excitation step carried out on slice 1 followed by a data acquisition step from slice 1, these steps are repeated for slice 3, repeated again from slice 5 etc. to slice N−1, and then repeated all over again with respect to slice 2, slice 4, slice 6 etc. to slice N.

The main magnetic field of an MR imager is never absolutely uniform, and in particular is always nonuniform along a direction orthogonal to the planes of the slices. Consequently, the magnetic field at slice 1 can be different from the magnetic field at slice 2, likewise different from the magnetic field at slice 3, and so on. Because the magnetic resonance frequency of the nuclei of any molecule (e.g. fat and water) varies linearly with the magnetic field in which the nuclei are located, the fat in slice 1 may have a different resonant frequency than e.g. the fat in slice 2. Furthermore, because the magnetic resonance frequencies of fat and water are comparatively close together and because the main magnetic field can be comparatively inhomogeneous, the resonant frequency of fat in one slice may be the resonant frequency of water in another slice. In consequence, because ordinary fat saturation pulses are not slice selective, a pulse intended to saturate the fat signal of the entire sample may actually saturate the water signal in one or more of the slices from which MR data are to be acquired. So, too, a pulse intended to excite the water in a particular slice may, if the main magnetic field has an intensity that is other than expected, actually excite the fat in that slice. Therefore, known techniques for producing MR images that lack a contribution from fat may, when used in multislice acquisitions, produce results that are otherwise than intended.

In accordance with one aspect of the invention, the excitation step (i.e. the application of one or more RF pulses to nutate the spins of molecules having the desired resonant frequency) for each slice of the patient is preceded by a saturation pulse that is spectrally selective but not spatially selective, and the frequency of the saturation pulse is varied on a slice-by-slice basis. Where the excitation step is made up of a group having more than one RF pulse, the saturation pulse precedes the entire group.

In accordance with another aspect of the invention, each slice of the patient is subjected to a spatially and spectrally selective saturation pulse and the spectral frequency of the saturation pulse is varied on a slice-by-slice basis.

In accordance with still another aspect of the invention, each slice of the patient is subjected to a spatially and spectrally selective excitation as part of an MR pulse sequence, and at least one RF characteristic of the excitation is varied on a slice-by-slice basis. Advantageously, and in accordance with a preferred embodiment, RF phase and frequency are varied.

In accordance with yet a further aspect of the invention that is particularly well adapted to multislice fat saturation studies, a two-step procedure is followed. In the first step, there is an advance identification of all pairs of slices in which the first slice in each pair has a fat resonance frequency that is equal to the water resonance frequency of the second slice in each pair. In the second step, the MR study is so conducted that the excitation of the water resonance in the second slice in any single pair is never the second water resonance excitation step immediately following saturation of the fat signal from the first slice in that pair. In this way, whenever the saturation pulse appropriate for the fat signal in one slice inadvertently causes the water signal of another slice to become saturated, the saturated water signal is permitted to undergo T1 recovery for some time before MR image data are acquired from the slice in which the water signal has been saturated.

BRIEF DESCRIPTION OF THE DRAWINGS

The invention will be better understood with reference to the following illustrative and non-limiting drawings, in which.

DETAILED DESCRIPTION OF PREFERRED EMBODIMENTS

The description below implicitly assumes that the frequencies of the water and fat resonances are known a priori on a slice-by-slice basis. Persons skilled in the art know how to measure these frequencies in advance. (Exemplary articles on this subject are Schneider et al., Magnetic Resonance in Medicine, Vol. 18, p. 335 ff. (1991) and Webb et al., Magnetic Resonance in Medicine, Vol. 20, p. 113 ff. (1991).

The consequences of inhomogeneity of the main magnetic field in an MR scanner in a multislice MR study will first be discussed in connection with FIGS. 1, 2, 3 and 4.

Figure 1:
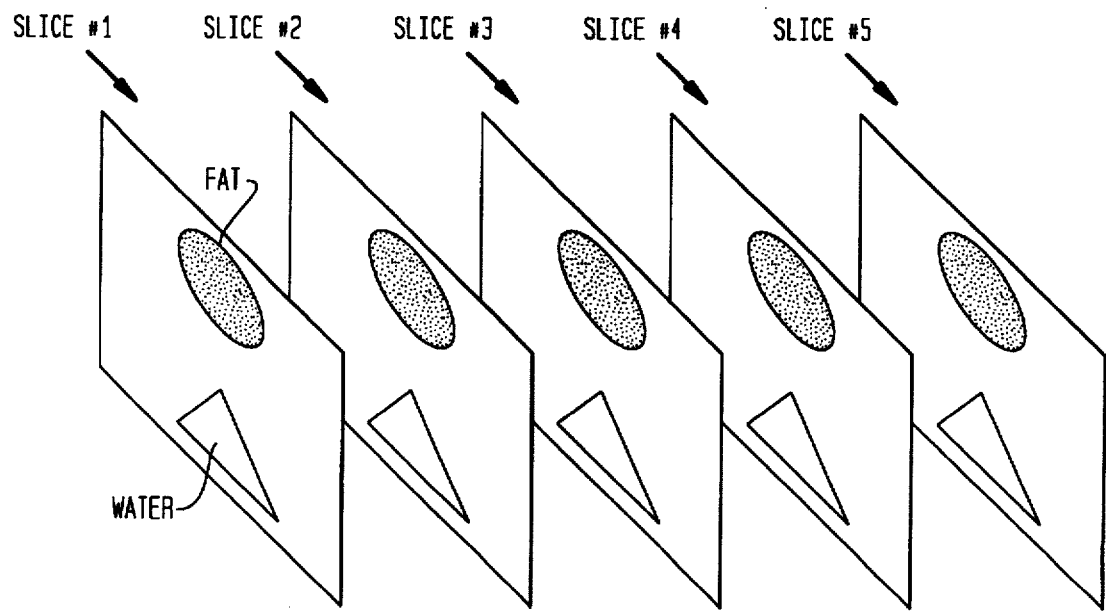
FIG. 1 schematically illustrates a five-slice MR study in which fat suppression and water excitation are carried out in an optimum manner.
Figure 3:
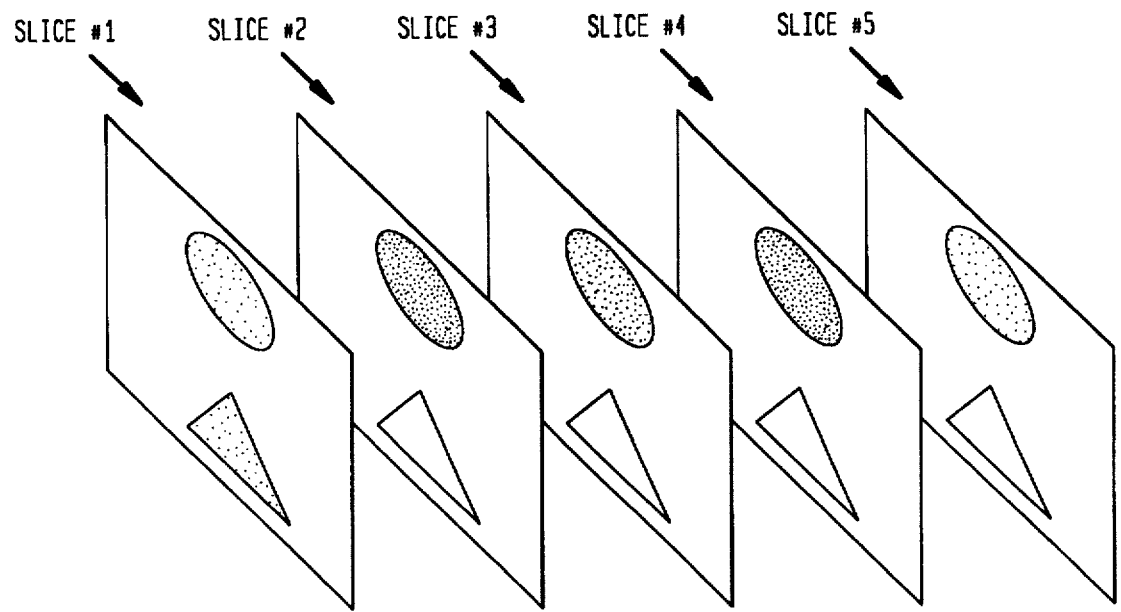
FIGS. 3 and 4 illustrate how single-frequency fat saturation pulses can produce non-optimum results in a five-slice MR study.

In a five-slice MR study such as is schematically illustrated in FIGS. 1 and 3, there are regions of water-containing tissues and regions which contain fat. ("Fat", as used herein, means lipid-containing tissue; the lipids in such tissues are the source of the "fat signal".) As shown, regions of water-containing tissue are triangular, and regions containing fat are circular.

Ideally, images of each of these five slices will appear as in FIG. 1; regions of fat will be dark and therefore will not contribute to the image, while regions of water-containing tissue will be bright and will dominate the image. However, as will be shown below, inhomogeneities in the main magnetic field, i.e. changes in the intensity of the main magnetic field as measured along a direction orthogonal to the slice plane make FIG. 1 results quite difficult to achieve.

Figure 2:
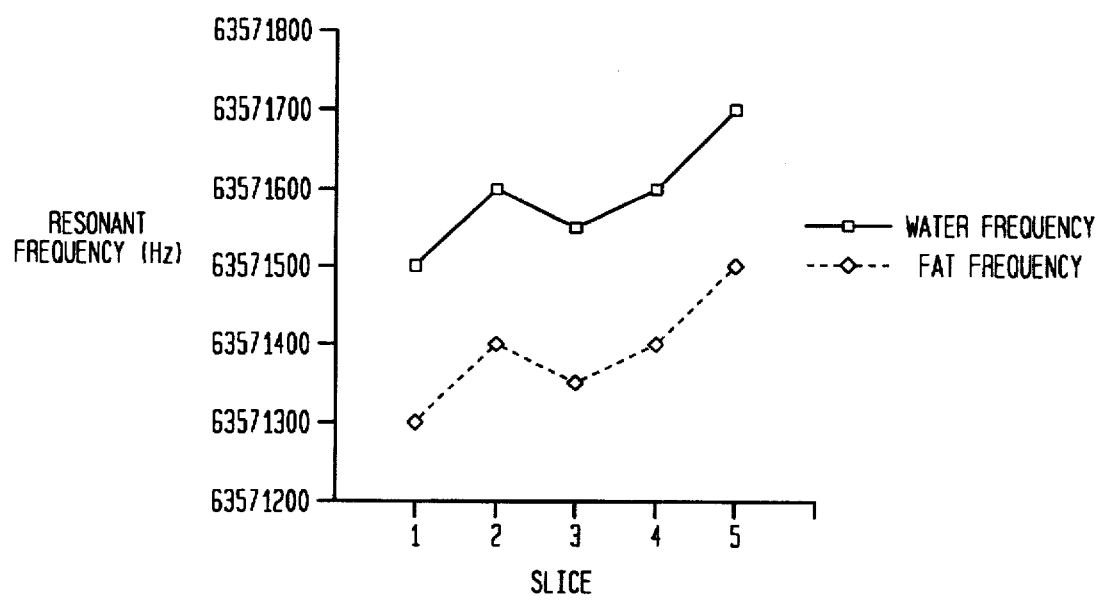
FIG. 2 illustrates how the resonant frequencies of water and fat can vary in a five-slice MR study at a nominal main magnetic field strength of 1.49 tesla.

FIG. 2 shows how such inhomogeneities can cause the frequencies of the fat and water resonances to vary from slice to slice within a single sample. (These frequencies are typical for an MR imager operating at a main magnetic field strength of 1.49 tesla.) In particular, FIG. 2 shows how the frequency of the fat resonance in slice 5 is the same as the frequency of the water resonance in slice 1. Thus, if a fat saturation pulse at 63571400 Hz is applied to a sample in accordance with FIG. 2, the fat signals in slices 2 and 4 will be fully saturated and will not contribute to the images of those slices. Additionally, the fat signal in slice 3 will be substantially saturated because the saturation pulse is close to the saturation frequency of slice 3. However, the fat signals in slices 1 and 5 will only be slightly saturated, and will make substantial contributions to the images of those slices. Furthermore, the water signal from slice 1 will be somewhat suppressed, because the saturation pulse is close to the 63571500 Hz frequency of the water signal in slice 1. These results are schematically illustrated in FIG. 3.

Figure 4:
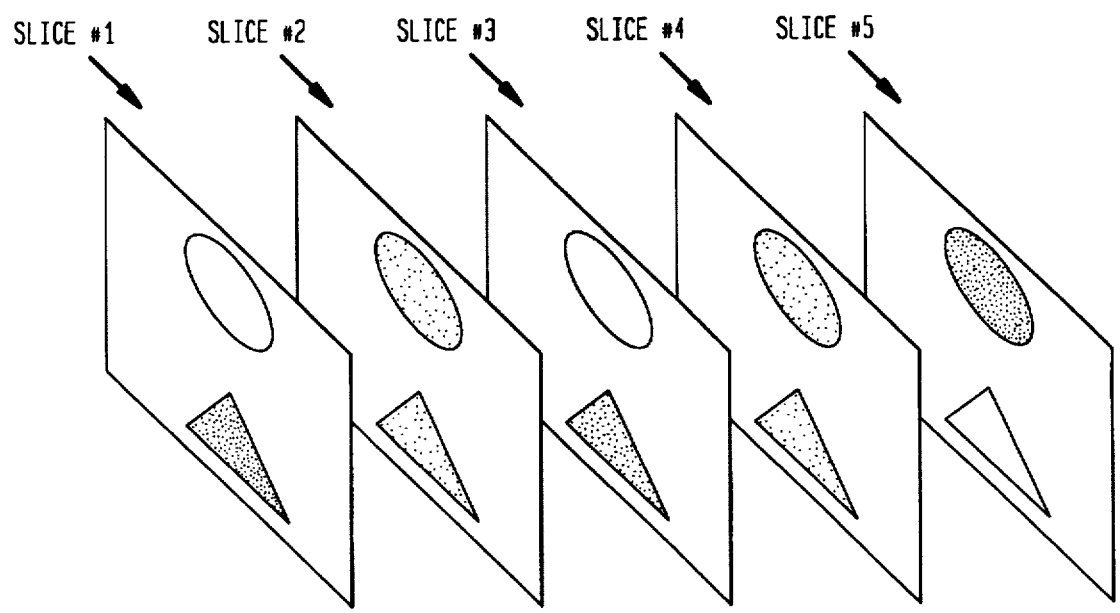

As is shown in FIG. 4, these results are even more unfavorable where the saturation pulse has a frequency of 63571500 Hz. In this instance, only in slice 5 is the fat signal saturated, and the water signal is saturated in slice 1.

Figure 5:
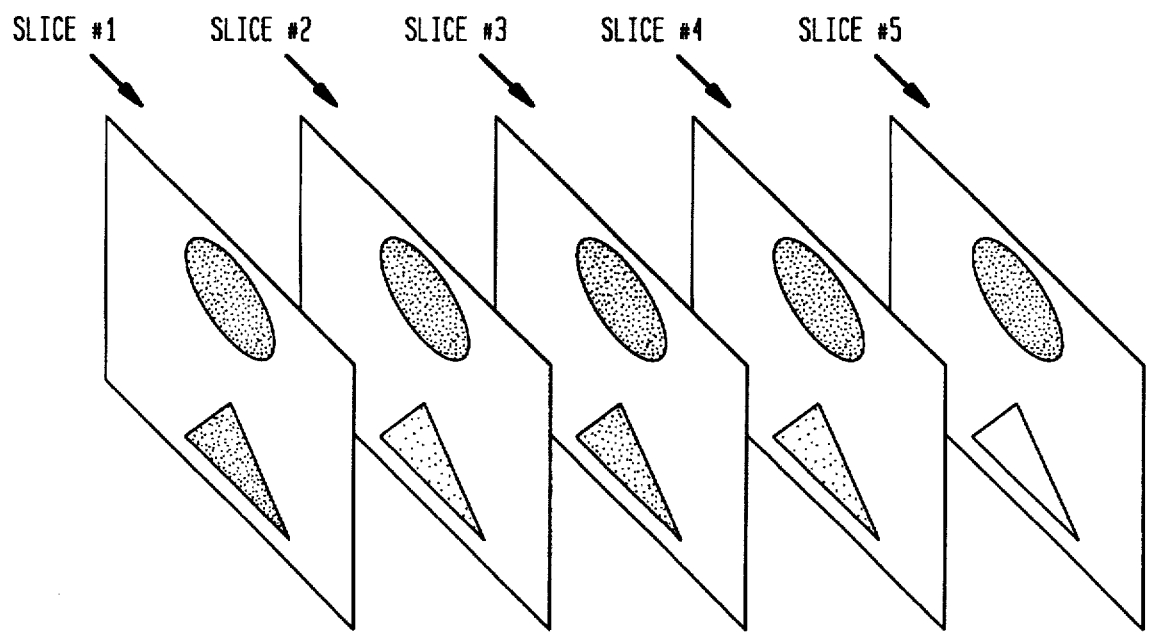
FIG. 5 schematically illustrates how a first preferred embodiment of the invention can not only saturate the fat signal in all the slices but can totally or partially saturate the water signal from one or more slices as well.

Two variants of the first preferred embodiment of the invention will now be described in connection with FIGS. 2 and 5. In accordance with a first preferred embodiment of the invention, the frequency of the saturation pulse is varied on a slice-by-slice basis, to match the frequencies shown e.g. in FIG. 2. For example, let it be assumed that a two-dimensional fat-suppressed MR study is to be conducted on slices A, B, and C. In accordance with the preferred embodiment, a non-spatially selective fat saturation pulse will be delivered to all the slices A, B and C at a frequency appropriate for saturating the fat signal in slice A. Then, the water signal will be excited in slice A and MR data will be acquired from slice A. Next, a non-spatially selective fat saturation pulse will be delivered to all the slices A, B and C at a frequency appropriate for saturating the fat signal in slice B. Then, the water signal will be excited in slice B and MR data will be acquired from slice B. Finally, a non-spatially selective fat saturation pulse will be delivered to all the slices A, B and C at a frequency appropriate for saturating the fat signal in slice C. This will be followed by an excitation of the water signal in slice C and acquisition of MR data from slice C. This ensures that the excitation of the desired resonance in a particular slice is immediately preceded by a non-spatially selective fat saturation pulse, having a frequency that is appropriate to saturate the fat signal from that slice, and also ensures that a minimum of time elapses between this saturation and excitation. This consequently ensures that the nutated spins of the fat nuclei in the slice have a minimum of time to relax back into alignment with the z-axis and to so contribute to the MR image of that slice.

It will be understood that in certain instances, a radiologist may desire to excite signals other than water (e.g. silicone, in breast studies of women who have had breast implants for cosmetic reasons) and may desire to suppress signals other than fat (e.g. the water signal in such breast studies). The invention applies equally well to such instances; it is only necessary to suitably adjust the parameters of the MR pulse sequence, which is within the capability of persons skilled in the art. Additionally, while the above examples are so formulated that e.g. the frequency of the fat resonance in slice 5 is exactly equal to the frequency of the water resonance in slice 1, these two frequencies need not be exactly identical. Persons skilled in the art know that such exact equality is not necessary for the above-described phenomena to occur. As used herein, the term "equal" encompasses inequalities as well, provided that such inequalities are sufficiently small as to produce results that are qualitatively the same as exact equalities.

In certain circumstances, varying the frequency of the saturation pulse on a slice-by-slice basis in accordance with the first preferred embodiment of the invention will produce unsatisfactory results. This is because of the way in which two-dimensional multislice fat-saturated MR studies are conducted (see above). In such studies, only a comparatively short time is required for conventional excitation and readout of the water signal in each slice. Thus, the volume made up of slices A, B and C is subjected to three fat saturation pulses in quick succession.

Let it be assumed that the fat saturation pulse chosen to saturate the fat signal in slice A turns out to have a frequency equal to that of the water resonance in slice B. Let it also be assumed that the time between this first saturation pulse and the excitation and readout of the water signal from slice B is shorter than the T1 of the particular water-containing tissue in slices A, B and C. Then, the water signal in slice B will be partially or even totally saturated and water-containing tissues in slice B will therefore not be properly imaged. In other words, it is not sufficient to saturate the fat signal in each slice; it is also necessary to avoid saturating the water signal in other slices. This situation is schematically illustrated in FIG. 5.

This inadvertent saturation of the water signal may be minimized or avoided by replacing the non-spatially selective fat saturation pulses by spatially-selective fat saturation pulses, the spectral selectivity of each such pulse being adjusted by means described below to excite only the fat signal of the slice from which MR image data is about to be acquired. After this fat signal is saturated, a conventional MR pulse sequence is used to excite and image the water of this slice.

In circumstances of inadvertent water saturation, the second or third preferred embodiments of the invention will likely be preferable. Two variants of the second preferred embodiment will now be described in connection with FIGS. 6 to 16.

In accordance with the second preferred embodiment of the invention, the spatially selective excitation step of a conventional two-dimensional MR pulse sequence is replaced with an excitation step that is not only spatially selective, but spectrally selective as well. This is achieved with spatially selective and spectrally selective excitation pulses of the binomial type (binomial-type pulses are defined in Hore, Journal of Magnetic Resonance, Vol. 55, p. 283 ff. (1983)). For simplicity, spatially and spectrally selective excitation pulses of the binomial 1 - 1 type will be described first. This will illustrate the principle by which the second preferred embodiment operates. Then, spatially and spectrally excitation pulses of the binomial 1 - 2 - 1 type will be described. Such 1 - 2 - 1 binomial pulses are presently preferred, because the spectral selectivity of such pulses is more suitable for fat suppression.

Turning first to the instance.(see FIG. 6) wherein excitation pulses of the 1 - 1 binomial type are utilized, a particular slice is selected by applying an initial RF pulse a and a gradient pulse c. As shown in FIG. 7, this nutates the water and fat spins by 45° towards the x - y plane. (FIGS. 7 to 10 are drawn in the conventional rotating frame of reference, said frame rotating at the precessional frequency of the water magnetization.)

Figure 8:
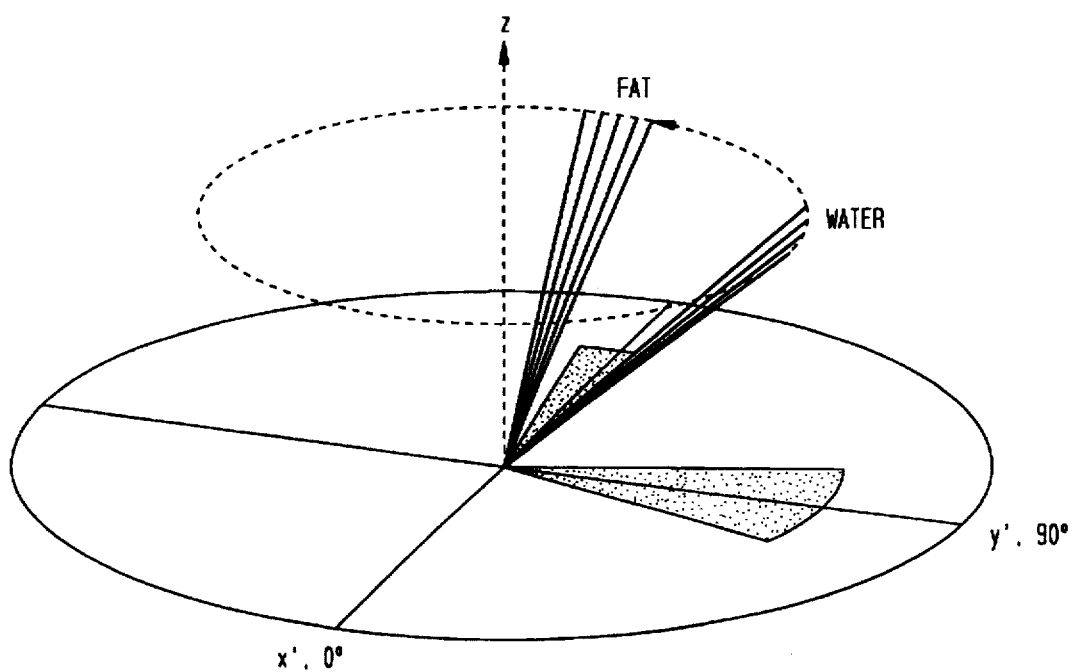

As has been illustrated above in FIG. 2, for any given main magnetic field strength, the frequency of the fat resonance is always less than the frequency of the water resonance. Therefore, within the x - y plane, the water spins precess faster than do the fat spins. As a result, the magnetization vectors of the fat and water dephase from each other. (In FIG. 8, which illustrates the situation at time g in FIG. 6, this is shown by the separation between the group of fat spins and the group of water spins.) Additionally, the individual water spins are dephased from each other by that part of the gradient pulse c which follows the RF pulse a; this part is shown in shading, and is indicated by reference figure f. The same is true of the individual fat spins. As a result of this dephasing, the various spins within each category (i.e. fat spins and water spins) separate from each other as a function of their position, and hence resonant frequency. (This is shown in FIG. 8 by the separation between individual magnetization vectors of water and the separation between individual magnetization vectors of fat.)

Figure 6:
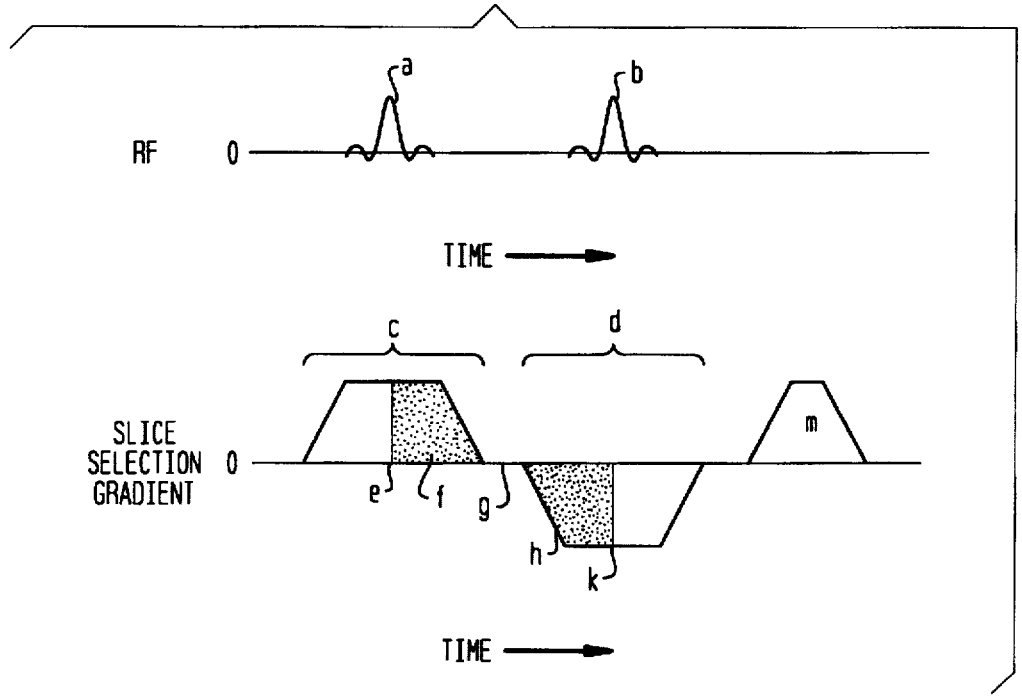
FIG. 6 illustrates an MR pulse sequence in accordance with a second preferred embodiment of the invention.
Figure 7:
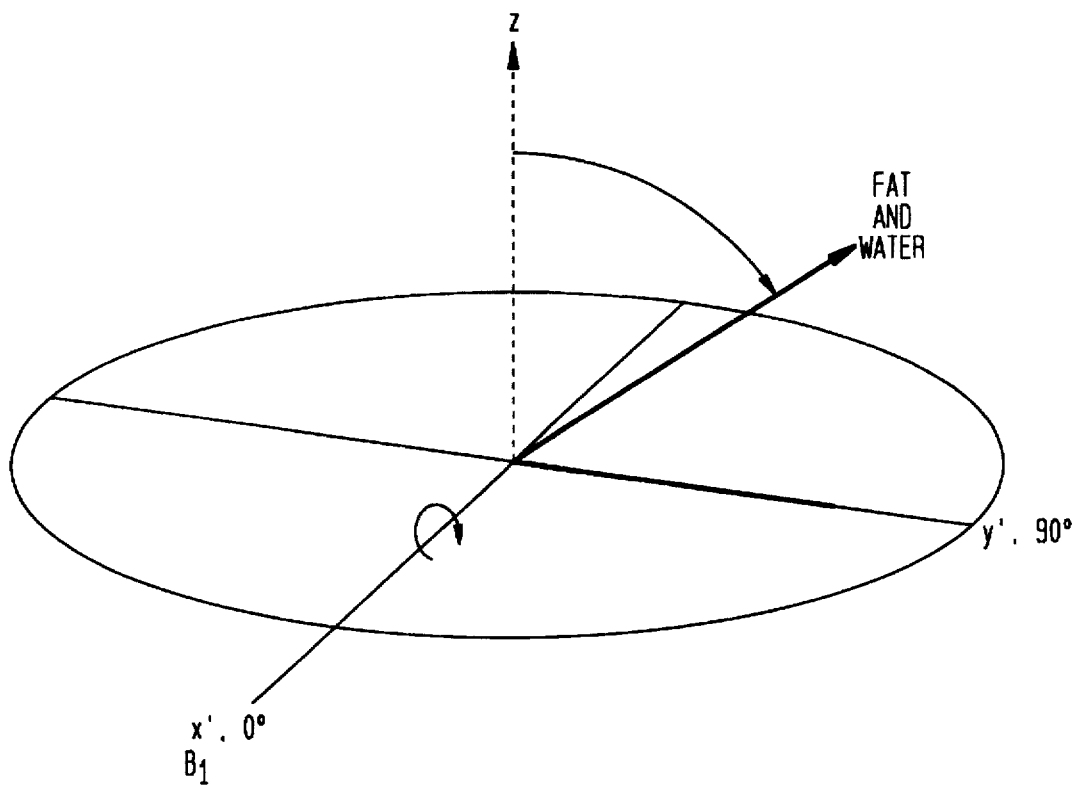
FIGS. 7, 8, 9 and 10 show how the FIG. 6 pulse sequence operates to excite the water signal in a particular slice while creating no net excitation of the fat signal anywhere.

After time g in FIG. 6, the portion h of the gradient pulse d reverses the dephasing between individual water spins and the dephasing between individual fat spins. However, this reversal does not affect the dephasing that occurs between fat spins as a category and water spins as a category, and the net water magnetization vector continues to precess more rapidly than does the net fat magnetization vector.

Figure 9:
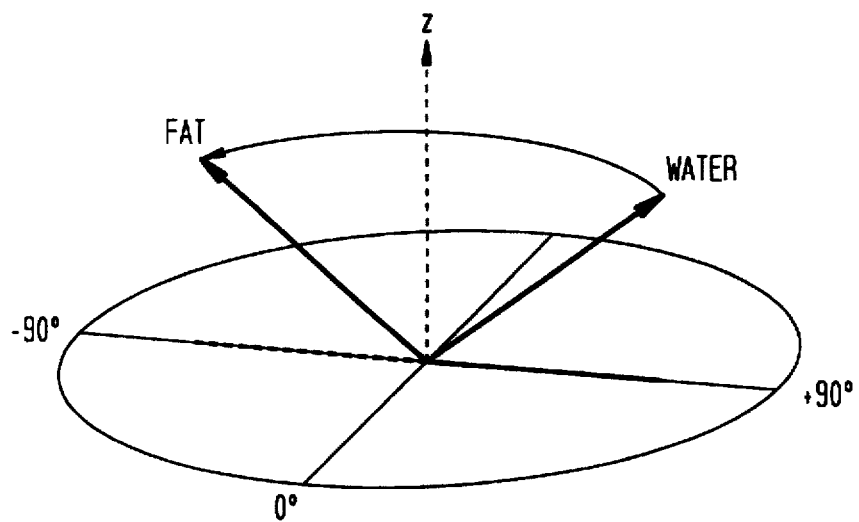
Figure 10:
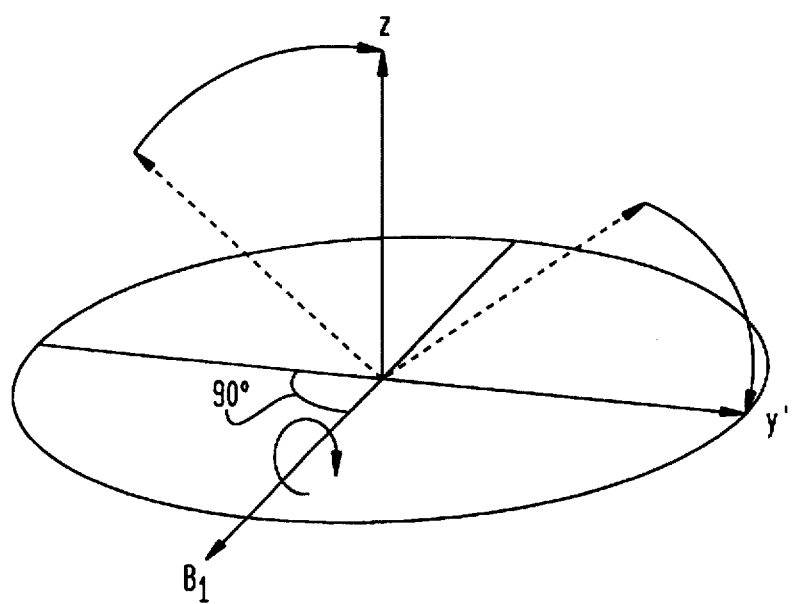

This dephasing is permitted to continue until the situation illustrated in FIG. 9 comes about. Here, the projection in the x - y plane of the fat magnetization vector is offset by 180° from the projection in the x - y plane of the water magnetization vector. At this point, shown as time k in FIG. 6, the second RF pulse b is applied, rotating the fat spins and the water spins by 45°. As a result, the fat spins are once again aligned with the z-axis of the imager, while the water spins are nutated into the x - y plane, where they can contribute to the MR image (see FIG. 10). The phase of this second RF pulse b is adjusted to lie 90° from the projection of the fat magnetization vector onto the x - y plane as indicated in FIG. 10. Ignoring the effects of the RF pulses, the phase (in radians) of the fat magnetization vector at any time from moment e to moment k in FIG. 6 may be computed as $$\theta_2 = \theta_1 + 2\Pi f_0(t_2 - t_1) + 2\Pi d\gamma \int_{t=t_1}^{t=t_2} G(t)dt \quad \text{(Equation 1)}$$

wherein $\theta_1$ is the phase at some time $t_1$, $\theta_2$ is the phase at some time $t_2$, $f_0$ is the frequency of the fat resonance in the absence of gradient fields at the selected slice position located d meters from the gradient coil isocenter, $\gamma$ is the magnetogyric ratio in hertz per millitesla, and $G(t)$ is the field gradient in millitesla per meter as a function of time.

In practice, the RF transmitter frequency will probably be different from the frequencies of the fat resonance or the water resonance. It is sufficient to use Equation 1 to compute the difference in phase between the fat magnetization vectors at times e and k in FIG. 6, and to adjust the RF phase of the second RF pulse b such that the required 90° phase difference between the RF field and the fat magnetization vector is obtained at time k (the peak of the RF pulse b and the time of gradient refocussing of lobes f and h). The original −90° relationship between the magnetization vector of fat and the RF field in FIG. 7 is a natural consequence of the nutation. The phase shifting hardware of typical MR imagers is capable of making this phase adjustment.

Figure 18:
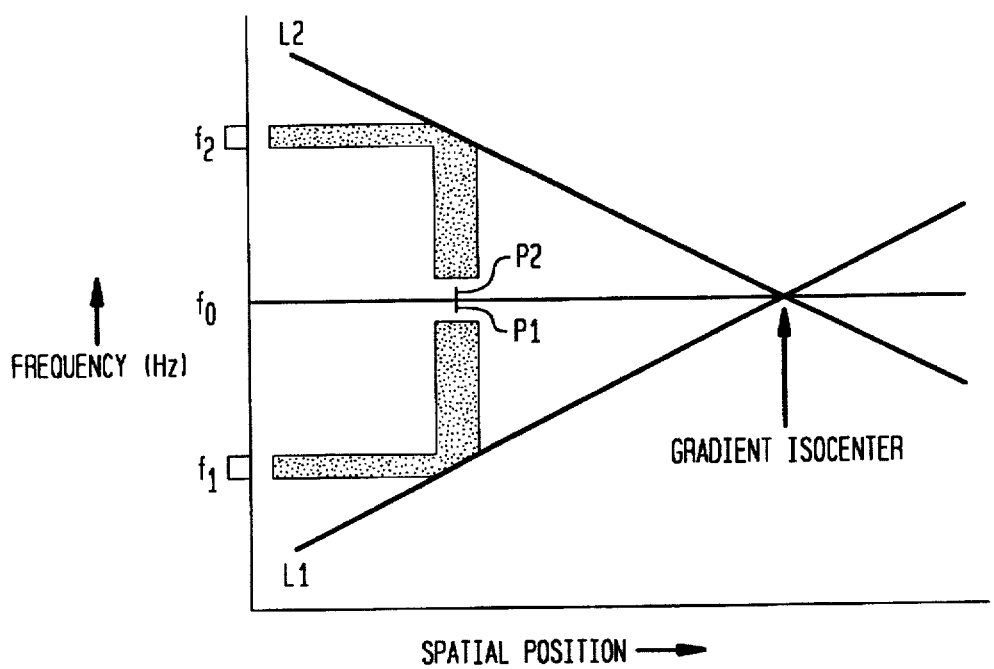
FIG. 18 shows how the RF frequencies of a 1 - 1 spatially and spectrally selective binomial pulse or the first or last two pulses of a 1 - 2 - 1 spatially and spectrally selective binomial pulse are adjusted to select the same slice.
Figure 19:
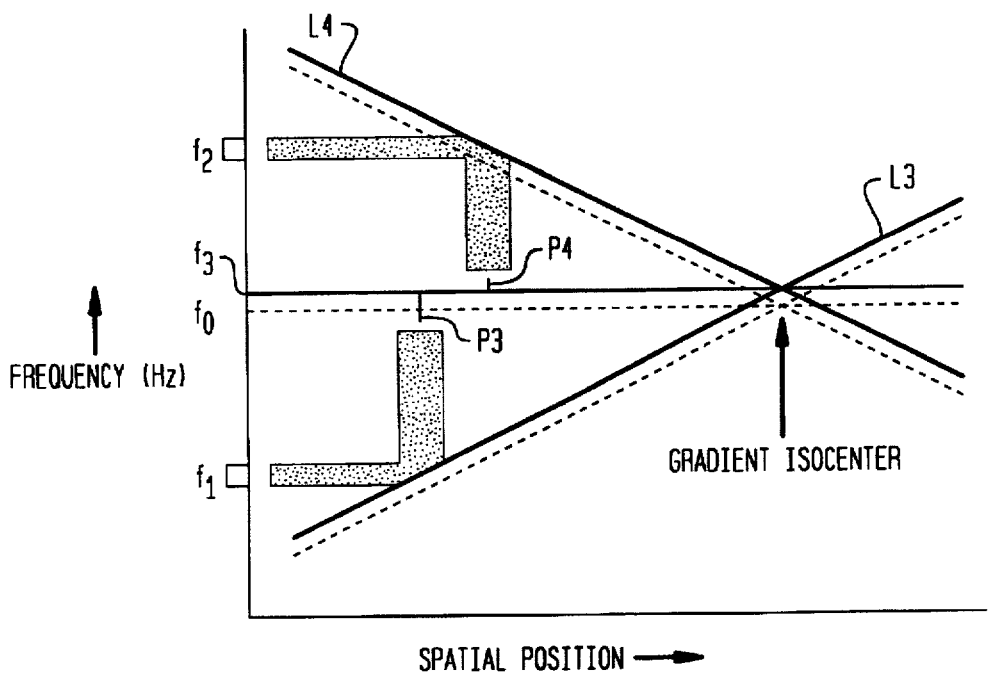
FIG. 19 shows how an uncompensated inhomogeneity in the main magnetic field causes the several RF pulses of spatially and spectrally selective pulses of the binomial type to select different and incorrect slice positions.

There is an advantage to combining such a phase adjustment with a slice-by-slice adjustment to the transmitter frequency. Frequency adjustment ensures that both RF pulses will select spins at the same slice position. Line L1 of FIG. 18 shows the relationship between RF frequency and slice position for pulse a of FIG. 6. The resonant frequency in the absence of field gradients is $f_0$. Frequency band $f_1$ is computed from knowledge of the gradient strength to excite a slice centered at position P1. The gradient is reversed during the second RF pulse b of FIG. 6, so a new frequency $f_2$ is computed to excite the same slice position P2. If, because of inhomogeneity of the main magnetic field, the true resonant frequency is $f_3$ (FIG. 19 shows an example that is exaggerated for clarity), line L1 is shifted to L3, and the line L2 is shifted to L4. Unless corrections are made to frequencies $f_1$ and $f_2$, the slices selected by RF pulses a and b of FIG. 6 will not select the same slice (P3 and P4 of FIG. 19), and both spectral and spatial errors will result.

The presently-preferred second variant of the second preferred embodiment of the invention will now be described with reference to FIGS. 11 to 16. In this instance, the excitation pulses are spatially and spectrally selective and are of the 1 - 2 - 1 binomial type (see FIG. 11). (As in the case of FIGS. 7 to 10, FIGS. 12 to 16 are drawn in the conventional rotating frame of reference, said frame rotating at the precessional frequency of the water magnetization.)

Figure 11:
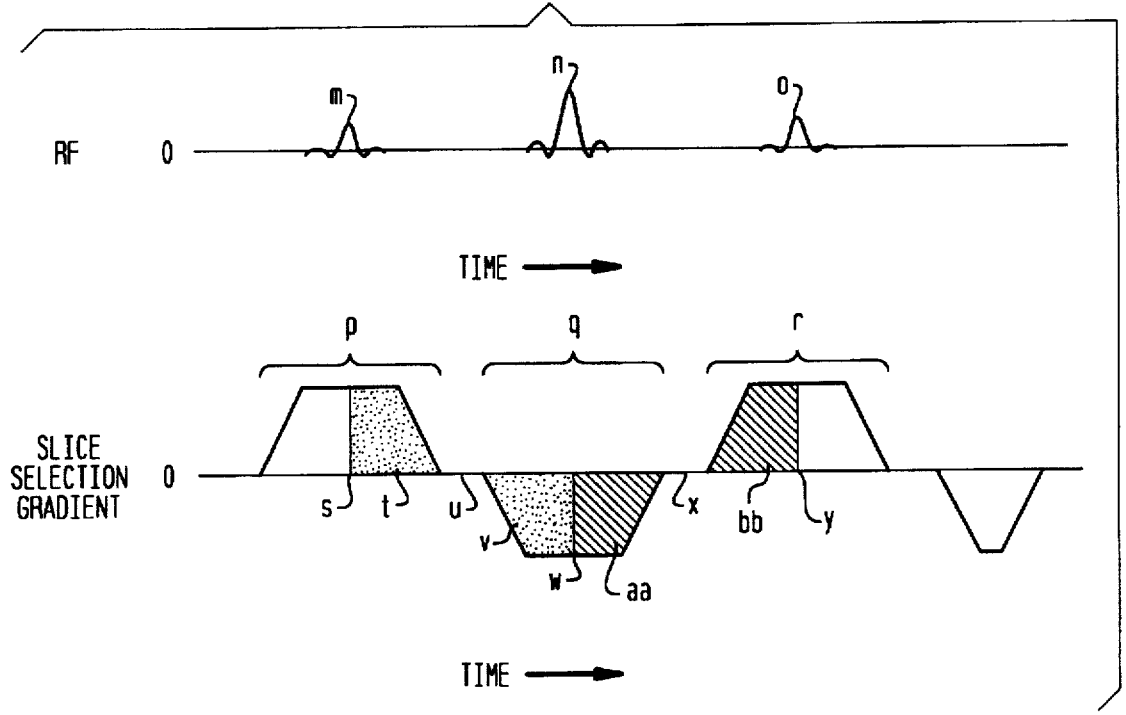
FIG. 11 illustrates another MR pulse sequence in accordance with the second preferred embodiment of the invention.
Figure 12:
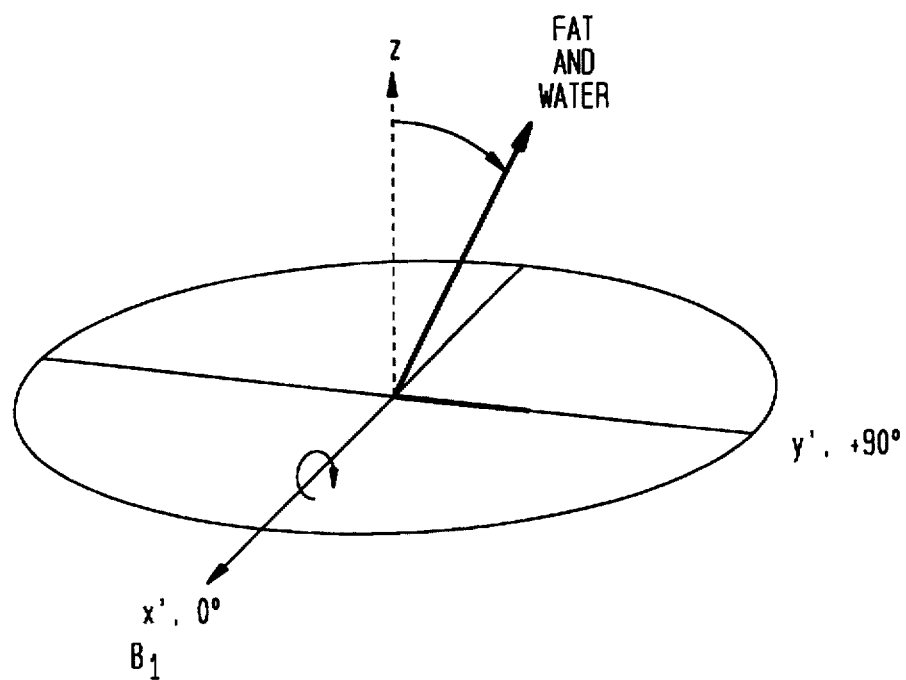
FIGS. 12, 13, 14, 15 and 16 show how the FIG. 11 pulse sequence operates to excite the water signal in a particular slice while creating no net excitation of the fat signal anywhere.

At the beginning of the pulse sequence, a particular slice is selected by applying an initial RF pulse m and a gradient pulse p (see FIG. 11). As shown in FIG. 12, this nutates the fat and water spins by 22.5° towards the x - y plane. As before, the different frequencies of the fat and water resonances cause the net magnetization vector of the water to precess more rapidly than the net magnetization vector of the fat, and the fat and water magnetization vectors dephase in the x - y plane.

Figure 13:
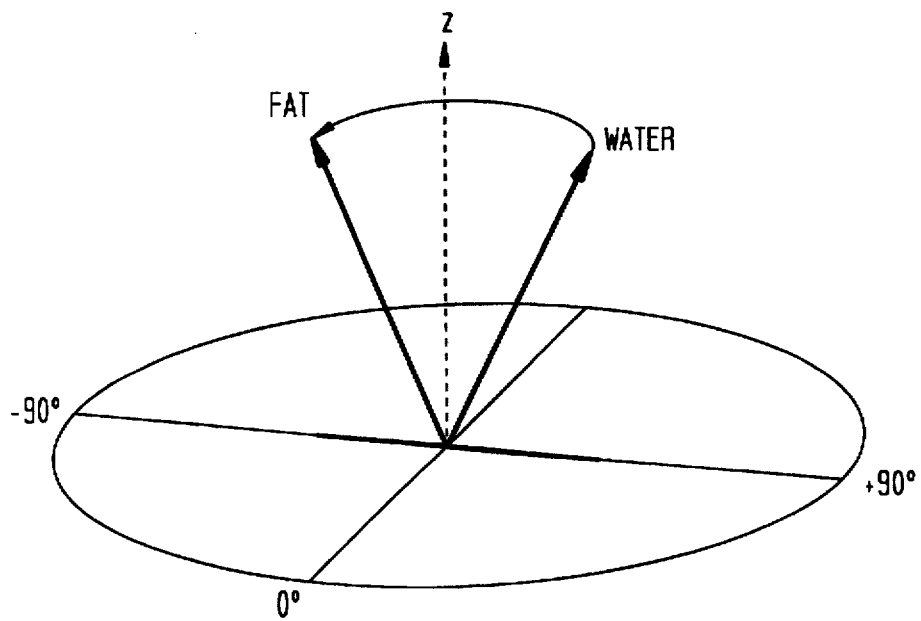
Figure 14:
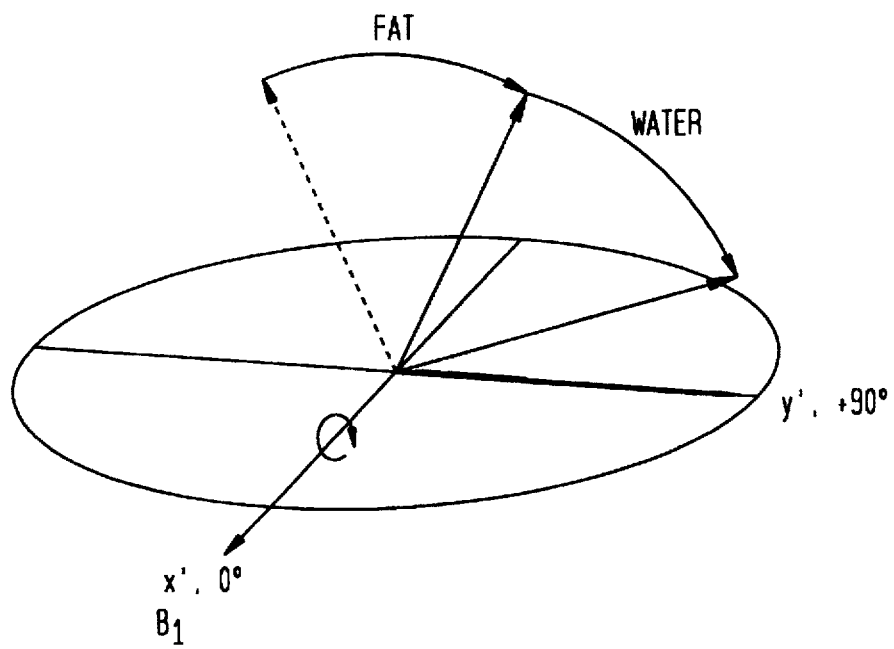
Figure 15:
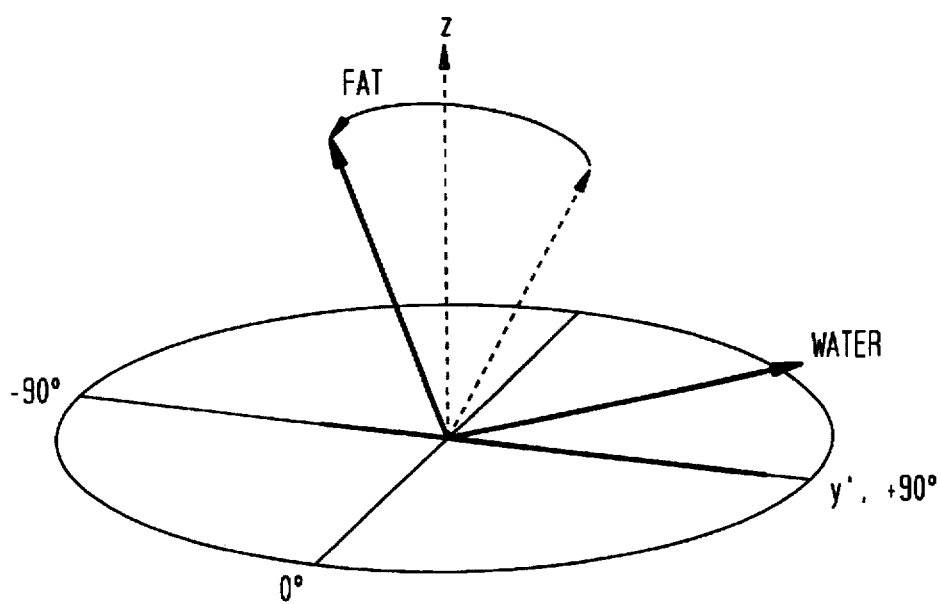
Figure 16:
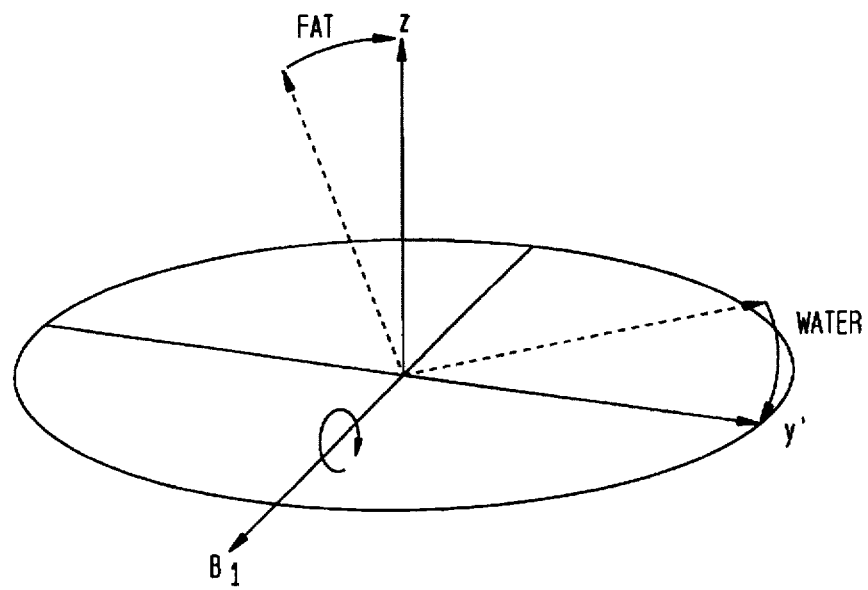

As likewise described above in connection with spatially and spectrally selective excitation of the 1 - 1 binomial type, the fat and water magnetization vectors are permitted to continue to dephase until the situation illustrated in FIG. 13 comes about. (The illustrated FIG. 13 situation occurs at time w in FIG. 11.) Here, too, the projection in the x - y plane of the fat magnetization vector is offset by 180° from the projection in the x - y plane of the water magnetization vector. Then, the second RF pulse n in FIG. 11 is applied, nutating both the fat spins and the water spins by 45° as shown in FIG. 14. Once again, dephasing of the fat spins and the water spins is permitted continue until, as before, the projection in the x - y plane of the fat magnetization vector is offset by 180° from the projection in the x - y plane of the water magnetization vector. This situation, illustrated in FIG. 15, occurs at time y in FIG. 11. Then, the third RF pulse o is applied, nutating the fat spins and the water spins by 22.5°. This, as illustrated in FIG. 16, brings the fat spins into parallelism with the z-axis of the MR imager and brings the water spins into the x - y plane where they can contribute to the MR image. As before, the required phases of the second and third RF pulses n and o are computed using Equation 1 and are adjusted with the phase shifting hardware of the imager to lie 90° from the projection of the fat magnetization vector onto the x - y plane.

As described above in connection with spatially and spectrally selective excitation of the 1 - 1 binomial type, there is a gradient-induced dephasing between individual water spins, and so too between individual fat spins. This dephasing occurs during the shaded time period t in FIG. 11 and is reversed during the shaded time period v in FIG. 11. So, too, this dephasing occurs during the shaded time period aa in FIG. 11, and is reversed during the shaded time period bb in FIG. 11, but for clarity this dephasing has not been shown in FIGS. 12 to 16.

Figure 17:
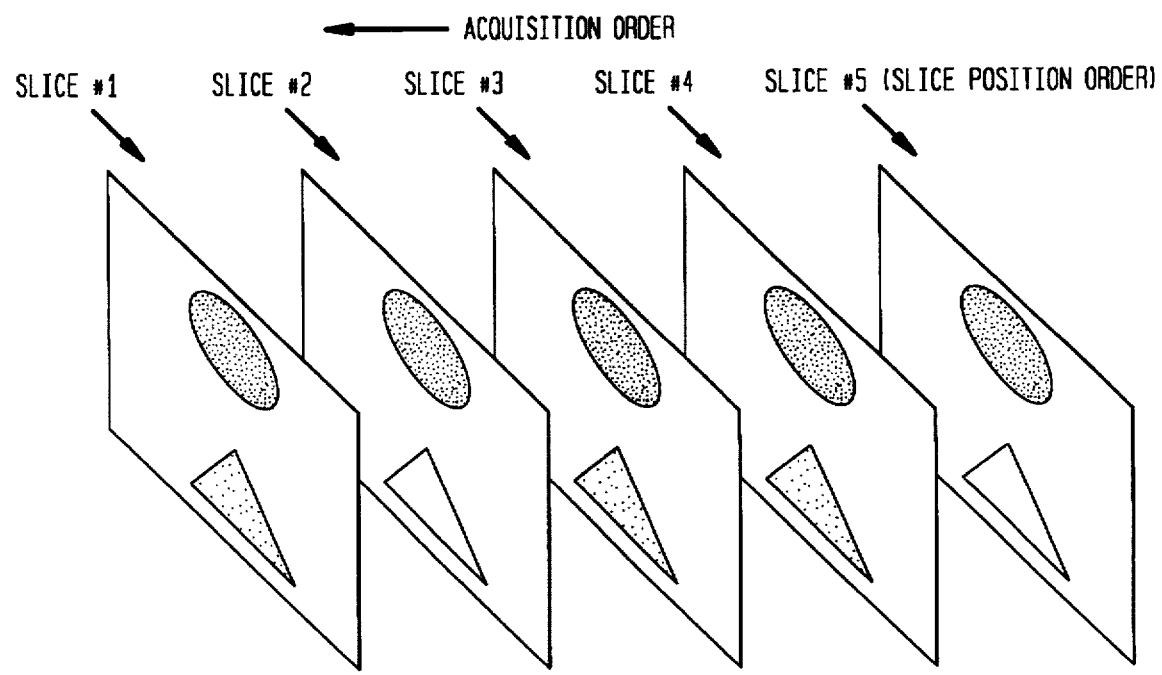
FIG. 17 shows a third preferred embodiment of the invention.

A third preferred embodiment of the invention will now be explained in accordance with FIGS. 5 and 17. As discussed above, a fat saturation pulse with a frequency appropriate to saturate the fat signal in slice 1 is initially delivered. This pulse is followed by excitation and readout of the water signal from slice 1. Next, the same procedure is followed for slices 2, 3, 4 and 5. Thereafter, the process is repeated for slice 1 again, but using a different phase-encoding gradient to read out another line of MR image data from slice 1. As before, this process is then repeated for slices 2, 3, 4 and 5. The cycle is then repeated once again at a still-different phase-encoding gradient. As can be seen from FIG. 5, the result of such a procedure is a saturated water signal in slice 1. This is because the frequency of the water resonance in slice 1 is the same as the frequency of the fat resonance in slice 5 and the water molecules in slice 1 do not have time to complete T1 recovery before the water signal is read out from slice 1.

To avoid such mishaps, in accordance with the invention there is a change in the order in which saturation pulses are applied and in which water signals are excited. Initially, pairs of slices are identified; the first slice in each pair has a fat resonance frequency equal to the water resonance frequency of the second slice in that pair. Then, the MR study is conducted, but in a manner that the water signal excitation step for the second slice in any single pair is never the second water signal excitation step immediately following saturation of the fat signal for the first slice in that pair. In the instance illustrated in FIG. 5, there would be one pair, the first slice in that pair would be slice 5 and the second slice in that pair would be slice 1. Therefore, in accordance with the third embodiment of the invention, the order of data acquisition would be so chosen that excitation of the water signal from slice 1 would never be the second water signal excitation step immediately following saturation of the fat signal from slice 5. (Note: excitation of the water signal from slice 5 would be the first water signal excitation step immediately following saturation of the fat signal from slice 5.) An acceptable order of data acquisition is illustrated in FIG. 17; as shown there, the order of MR image data acquisition is changed so that the data are acquired first from slice 5, next from slice 4, next from slice 3, next from slice 2, and finally from slice 1 (before the cycle is repeated once again).

All other things being equal, it is advantageous to maximize the time between acquisition of MR data from the first and second slices in any identified pair. This maximizes the opportunity for T1 relaxation, and thereby reduces or eliminates inadvertent saturation of the water signal. Clearly, this only applies if the study includes more than two slices.

Although a preferred embodiment has been described above, the scope of the invention is limited only by the following claims:

We claim:

1. A method of conducting a two-dimensional multislice MR study of a patient, comprising the steps of subjecting each slice of the patient to a spatially and spectrally selective excitation as part of an MR pulse sequence and varying at least one RF characteristic of said excitation on a slice-by-slice basis in such a manner that the same undesired signal in each slice does not contribute to the MR image.

2. The method of claim 1, wherein the MR pulse sequence contains RF pulses of the binomial type.

3. The method of claim 2, wherein the excitation pulses are of the 1 - 2 - 1 binomial type.

4. The method of claim 2, wherein the excitation pulses are of the 1 - 1 binomial type.

5. The method of claim 1, wherein said at least one RF characteristic is phase.

6. The method of claim 1, wherein the undesired signal is the fat signal.

7. The method of claim 1, wherein said at least one RF characteristic is phase and frequency.

* * * * *